United States Patent
Take et al.

(10) Patent No.: US 12,424,752 B2
(45) Date of Patent: Sep. 23, 2025

(54) WIRING BOARD AND METHOD FOR MANUFACTURING WIRING BOARD

(71) Applicant: Dai Nippon Printing Co., Ltd., Tokyo (JP)

(72) Inventors: Seiji Take, Tokyo (JP); Shuji Kawaguchi, Tokyo (JP); Chiaki Hatsuta, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 399 days.

(21) Appl. No.: 17/995,599

(22) PCT Filed: Apr. 9, 2021

(86) PCT No.: PCT/JP2021/015094
§ 371 (c)(1),
(2) Date: Apr. 24, 2023

(87) PCT Pub. No.: WO2021/206177
PCT Pub. Date: Oct. 14, 2021

(65) Prior Publication Data
US 2023/0253708 A1    Aug. 10, 2023

(30) Foreign Application Priority Data

Apr. 9, 2020    (JP) ................. 2020-070400

(51) Int. Cl.
*H01Q 9/04*    (2006.01)
*H01Q 21/00*   (2006.01)
*H01Q 21/28*   (2006.01)

(52) U.S. Cl.
CPC ....... *H01Q 9/0407* (2013.01); *H01Q 21/0093* (2013.01); *H01Q 21/28* (2013.01)

(58) Field of Classification Search
CPC .. H01Q 9/0407; H01Q 21/0093; H01Q 21/28; H01Q 1/40; H01Q 5/22;
(Continued)

(56) References Cited

U.S. PATENT DOCUMENTS

| | | |
|---|---|---|
| 2011/0237309 A1 | 9/2011 | Shoji et al. |
| 2018/0046283 A1 | 2/2018 | Yoshida et al. |

(Continued)

FOREIGN PATENT DOCUMENTS

| | | |
|---|---|---|
| JP | 2007-158555 A | 6/2007 |
| JP | 2011-066610 A1 | 3/2011 |

(Continued)

OTHER PUBLICATIONS

AN Extended European Search Report (Application No. 21784598.1) dated Apr. 4, 2024 (9 pages).

(Continued)

*Primary Examiner* — Seung H Lee
(74) *Attorney, Agent, or Firm* — BURR PATENT LAW, PLLC (57) ABSTRACT

A wiring board (10) includes a substrate (11) and a mesh wiring layer (20) disposed on the substrate (11) and including a plurality of wiring lines (21, 22). The substrate (11) has a transmittance of 85% or more for light with a wavelength of 380 nm or more and 750 nm or less. Each of the wiring lines (21, 22) includes a metal layer (27) and a blackened layer (28) disposed on the metal layer (27). The blackened layer (28) has a thickness ($T_2$) of 5 nm or more and 100 nm or less.

18 Claims, 7 Drawing Sheets

(58) Field of Classification Search
CPC .......... H01Q 1/38; H05K 1/165; H05K 3/244; H05K 3/108; H05K 3/386; H05K 2201/0108; H05K 2201/0338; H05K 2201/09681; H05K 2201/10098; H05K 1/0274; H05K 1/09; H05K 1/02
See application file for complete search history.

(56) References Cited

U.S. PATENT DOCUMENTS

| | | | |
|---|---|---|---|
| 2019/0035719 A1 | 1/2019 | Daitoku et al. | |
| 2020/0373653 A1 | 11/2020 | Suzuki et al. | |
| 2022/0192033 A1* | 6/2022 | Fukatsu | ................. C23C 18/38 |

FOREIGN PATENT DOCUMENTS

| | | | | |
|---|---|---|---|---|
| JP | 5636735 B2 | 12/2014 | | |
| JP | 2015-082178 A | 4/2015 | | |
| JP | 5695947 B2 | 4/2015 | | |
| KR | 10-2018-0044891 A | 5/2018 | | |
| TW | 201723774 A | 7/2017 | | |
| TW | 201911983 A | 3/2019 | | |
| WO | 2016/185942 A1 | 11/2016 | | |
| WO | WO-2018047608 A1 * | 3/2018 | ............. | G06F 3/041 |
| WO | 2018/193940 A1 | 10/2018 | | |
| WO | 2019/065782 A1 | 4/2019 | | |
| WO | 2019/107476 A1 | 6/2019 | | |
| WO | WO-2019188837 A1 * | 10/2019 | ............. | B32B 15/20 |

OTHER PUBLICATIONS

English translation of the International Preliminary Report on Patentability (Chapter I) dated Oct. 20, 2022 (Application No. PCT/JP2021/015094).
International Search Report and Written Opinion dated Jun. 29, 2021 (Application No. PCT/JP2021/015094).
Japanese Office Action (Application No. 2022-514138) dated Sep. 27, 2024 (with English translation) (7 pages).
Japanese Decision of Dismissal of Amendment (with English translation) dated Jan. 21, 2024 (Application No. 2022-514138).
Taiwanese Office Action (with English translation) dated Jan. 3, 2025 (Application No. 110112950).

* cited by examiner

WIRING BOARD AND METHOD FOR MANUFACTURING WIRING BOARD

TECHNICAL FIELD

An embodiment of the present disclosure relates to a wiring board and a method for manufacturing the wiring board.

BACKGROUND ART

Presently, smaller, thinner, and lighter portable terminal devices, such as smartphones and tablets, with higher functionality are being developed. These portable terminal devices use a plurality of communication bands, and therefore require a plurality of antennas corresponding to the communication bands. For example, a portable terminal device may include a plurality of antennas including a telephone antenna, a wireless fidelity (WiFi) antenna, a third generation (3G) antenna, a fourth generation (4G) antenna, a long term evolution (LTE) antenna, a Bluetooth (registered trademark) antenna, and a near field communication (NFC) antenna. However, to reduce the size of the portable terminal device, the space in which the antennas are arranged is limited, and the design flexibility of the antennas is reduced. In addition, since the antennas are arranged in a limited space, the radio wave sensitivity is not always satisfactory.

Accordingly, film antennas mountable in a display region of a portable terminal device have been developed. A film antenna is a transparent antenna including a transparent base material on which an antenna pattern is formed. The antenna pattern is formed of a conductor mesh layer having a mesh structure, which includes a conductor portion composed of an opaque conductor layer and a plurality of openings in which no conductor layer is formed.

PRIOR ART REFERENCES

Patent Documents

[Patent Document 1] Japanese Unexamined Patent Application Publication No. 2011-66610
[Patent Document 2] Japanese Patent No. 5636735
[Patent Document 3] Japanese Patent No. 5695947

The film antenna according to the related art includes a transparent base material on which a mesh wiring layer (conductor mesh layer) is provided. The mesh wiring layer may be readily visible to the naked eye when the mesh wiring layer easily reflects visible light.

The present embodiment provides a wiring board having a mesh wiring layer that is not readily visible to the naked eye and a method for manufacturing the wiring board.

DISCLOSURE OF THE INVENTION

A wiring board according to the present embodiment includes a substrate and a mesh wiring layer disposed on the substrate and including a plurality of wiring lines. The substrate has a transmittance of 85% or more for light with a wavelength of 380 nm or more and 750 nm or less. Each of the wiring lines includes a metal layer and a blackened layer disposed on the metal layer. The blackened layer has a thickness of 5 nm or more and 100 nm or less.

In the wiring board according to the present embodiment, the blackened layer may include palladium or tellurium.

In the wiring board according to the present embodiment, the blackened layer may be obtained by subjecting the metal layer to an oxidation process.

In the wiring board according to the present embodiment, the blackened layer may include an oxide of a metal contained in the metal layer.

In the wiring board according to the present embodiment, the mesh wiring layer may be an antenna.

In the wiring board according to the present embodiment, the metal layer may include gold, silver, copper, platinum, tin, aluminum, iron, or nickel.

In the wiring board according to the present embodiment, the substrate may have a dielectric loss tangent of 0.002 or less.

In the wiring board according to the present embodiment, the substrate may have a thickness of 5 μm or more and 200 μm or less.

In the wiring board according to the present embodiment, the substrate may include cycloolefin polymer or polynorbornene polymer.

In the wiring board according to the present embodiment, the mesh wiring layer may be provided only on a portion of the substrate.

A method for manufacturing a wiring board according to the present embodiment includes a step of preparing a substrate and a step of forming a mesh wiring layer including a plurality of wiring lines on the substrate. The substrate has a transmittance of 85% or more for light with a wavelength of 380 nm or more and 750 nm or less. Each of the wiring lines includes a metal layer and a blackened layer disposed on the metal layer. The blackened layer has a thickness of 5 nm or more and 100 nm or less.

In the method for manufacturing the wiring board according to the present embodiment, the step of forming the mesh wiring layer may include a step of forming the metal layer and a step of forming the blackened layer on the metal layer, the blackened layer including palladium or tellurium.

In the method for manufacturing the wiring board according to the present embodiment, the step of forming the mesh wiring layer may include a step of forming the metal layer and a step of subjecting the metal layer to an oxidation process to form the blackened layer.

In the method for manufacturing the wiring board according to the present embodiment, the blackened layer may include an oxide of a metal contained in the metal layer.

In the method for manufacturing the wiring board according to the present embodiment, the mesh wiring layer may be an antenna.

In the method for manufacturing the wiring board according to the present embodiment, embodiment, the metal layer may include gold, silver, copper, platinum, tin, aluminum, iron, or nickel.

In the method for manufacturing the wiring board according to the present embodiment, the substrate may have a dielectric loss tangent of 0.002 or less.

In the method for manufacturing the wiring board according to the present embodiment, the substrate may have a thickness of 5 μm or more and 200 μm or less.

In the method for manufacturing the wiring board according to the present embodiment, the substrate may include cycloolefin polymer or polynorbornene polymer.

In the method for manufacturing the wiring board according to the present embodiment, the mesh wiring layer may be provided only on a portion of the substrate.

According to the embodiment of the present disclosure, the mesh wiring layer is not readily visible to the naked eye.

DESCRIPTION OF EMBODIMENTS

An embodiment will be described with reference to FIGS. 1 to 9. FIGS. 1 to 9 illustrate the present embodiment.

Drawings described below are schematic diagrams. Therefore, sizes and shapes of the components are exaggerated as appropriate to facilitate understanding. Changes are possible as appropriate without departing from the technical idea. In each of the drawings described below, the same parts are denoted by the same reference signs, and detailed description thereof may be omitted. The numerical values of, for example, the dimensions and the materials of components described in this specification are examples of the embodiment. The numerical values and materials are not limited to the examples, and may be selected as appropriate. In this specification, terms relating to shapes and geometric conditions, such as "parallel", "orthogonal", and "perpendicular", are to be interpreted not only in a strict sense but also to cover states that are substantially the same as those in a strict sense.

In the embodiment described below, an "X direction" is a direction parallel to one side of a substrate. A "Y direction" is a direction perpendicular to the X direction and parallel to another side of the substrate. A "Z direction" is a direction perpendicular to both the X direction and the Y direction and parallel to a thickness direction of a wiring board. A "front surface" is a surface that faces in a positive Z direction and on which wiring lines are provided on the substrate. A "back surface" is a surface that faces in a negative Z direction and that is opposite to the surface on which the wiring lines are provided on the substrate.

[Structure of Wiring Board]

The structure of a wiring board according to the present embodiment will be described with reference to FIGS. 1 to 5. FIGS. 1 to 5 illustrate the wiring board according to the present embodiment.

Figure 1:
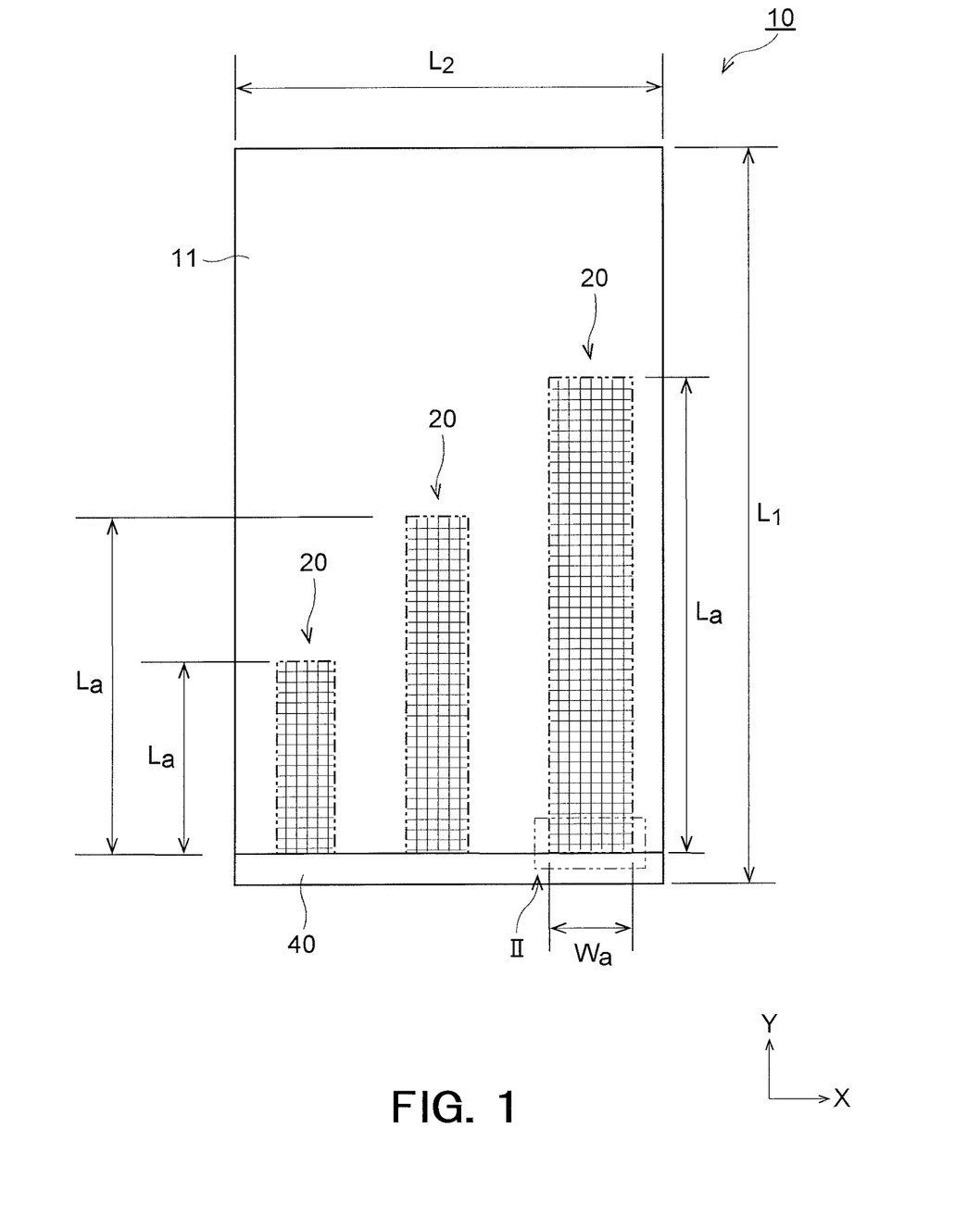
FIG. 1 is a plan view of a wiring board according to an embodiment.

As illustrated in FIG. 1, a wiring board 10 according to the present embodiment is disposed on, for example, a display of an image display device. The wiring board 10 includes a transparent substrate 11 and mesh wiring layers (wiring pattern regions) 20 arranged on the substrate 11. The mesh wiring layers 20 are electrically connected to a feeding unit 40.

The substrate 11 is substantially rectangular in plan view. The longitudinal direction of the substrate 11 is parallel to the Y direction, and the transverse direction of the substrate 11 is parallel to the X direction. The substrate 11, which is transparent, is substantially flat plate-shaped, and has a substantially uniform thickness over the entirety thereof. A length $L_1$ of the substrate 11 in the longitudinal direction (Y direction) may be selected from the range of, for example, 2 mm or more and 300 mm or less, preferably from the range of 100 mm or more and 200 mm or less. A length $L_2$ of the substrate 11 in the transverse direction (X direction) may be selected from the range of, for example, 2 mm or more and 300 mm or less, preferably from the range of 50 mm or more and 100 mm or less. The substrate 11 may have rounded corners.

The material of the substrate 11 may be any material that is transparent in the visible light range and that has electrically insulating properties. The material of the substrate 11 is polyethylene terephthalate in the present embodiment, but is not limited to this. The material of the substrate 11 is preferably an organic insulating material, for example, a polyester-based resin such as polyethylene terephthalate, an acrylic resin such as polymethyl methacrylate, a polycarbonate-based resin, a polyimide-based resin, a polyolefin-based resin such as cycloolefin polymer, or a cellulose-based resin material such as triacetyl cellulose. Alternatively, the material of the substrate 11 may be an organic insulating material such as cycloolefin polymer (for example, ZF-16 produced by Zeon Corporation) or polynorbornene polymer (produced by Sumitomo Bakelite Co., Ltd.). The material of the substrate 11 may instead be glass, ceramic, etc., as appropriate depending on the use. Although the substrate 11 is composed of a single layer in the illustrated example, the substrate 11 is not limited to this, and may instead have a multilayer structure including a plurality of base materials or layers. The substrate 11 may be film-shaped or plate-shaped. Thus, the thickness of the substrate 11 is not particularly limited, and may be selected as appropriate depending on the use. For example, a thickness (in the Z direction) $T_1$ of the substrate 11 (see FIGS. 4 and 5) may be in the range of, for example, 5 μm or more and 200 μm or less.

The substrate 11 may have a dielectric loss tangent of 0.002 or less, preferably 0.001 or less. The dielectric loss tangent of the substrate 11 has no particular lower limit, but may be more than 0. When the dielectric loss tangent of the substrate 11 is within the above-mentioned ranges, loss in gain (sensitivity) during transmission and reception of electromagnetic waves may be reduced, particularly in a case where high-frequency electromagnetic waves (for example, millimeter waves) are transmitted and received by the mesh wiring layers 20. The dielectric loss tangent of the substrate 11 has no particular lower limit. The dielectric constant of the substrate 11 is not particularly limited, and may instead be 2.0 or more and 10.0 or less.

The dielectric loss tangent of the substrate 11 may be measured in accordance with IEC 62562. More specifically, first, a specimen is prepared by cutting out a portion of the substrate 11 on which no mesh wiring layers 20 are formed. Alternatively, a portion of the substrate 11 on which the mesh wiring layers 20 are formed may be cut out, and then the mesh wiring layers 20 may be removed by, for example, etching. The specimen has a width in the range of 10 mm to 20 mm and a length in the range of 50 mm to 100 mm. Next, the dielectric loss tangent is measured in accordance with IEC 62562. The dielectric constant and the dielectric loss tangent of the substrate 11 may also be measured in accordance with ASTM D150.

The transmittance of the substrate 11 for visible light (light with a wavelength of 380 nm or more and 750 nm or less) may be 85% or more, preferably 90% or more. The transmittance of the substrate 11 for visible light has no particular upper limit, but may be, for example, 100% or less. When the transmittance of the substrate 11 for visible light is within the above-mentioned ranges, transparency of the wiring board 10 can be increased, and visibility of a display 91 of an image display device 90 (described below) can be enhanced. The visible light is light with a wavelength of 380 nm to 780 nm. The transmittance for visible light of 85% or more means that when the absorbance of the substrate 11 is measured with a known spectrophotometer (for example, spectrometer V-670 manufactured by JASCO Corporation), the transmittance is 85% or more over the entire wavelength range of 380 nm to 780 nm.

In the present embodiment, the mesh wiring layers 20 are composed of antenna pattern regions having a function of an antenna. In FIG. 1, the mesh wiring layers 20 (three in number), which are formed on the substrate 11, correspond to different frequency bands. More specifically, the mesh wiring layers 20 have different lengths (lengths in the Y direction) $L_a$, each of which corresponds to a specific frequency band. The mesh wiring layers 20 corresponding to frequency bands with lower frequencies have longer lengths $L_a$. When, for example, the wiring board 10 is disposed on a display 91 of an image display device 90 (see FIG. 9 described below), each mesh wiring layer 20 may correspond to, for example, a telephone antenna, a WiFi antenna, a 3G antenna, a 4G antenna, a 5G antenna, an LTE antenna, a Bluetooth (registered trademark) antenna, or an NFC antenna. The mesh wiring layers 20 may be formed such that the mesh wiring layers 20 do not extend over the entire region of the substrate 11 but exist only in partial regions on the substrate 11.

Each mesh wiring layer 20 is substantially rectangular in plan view. The longitudinal direction of each mesh wiring layer 20 is parallel to the Y direction, and the transverse direction of each mesh wiring layer 20 is parallel to the X direction. A length $L_a$ of each mesh wiring layer 20 in the longitudinal direction (Y direction) may be selected from the range of, for example, 1 mm or more and 100 mm or less. A width $W_a$ of each mesh wiring layer 20 in the transverse direction (X direction) may be selected from the range of, for example, 1 mm or more and 10 mm or less. The mesh wiring layers 20 may be millimeter wave antennas. When the mesh wiring layers 20 are millimeter wave antennas, the length $L_a$ of each mesh wiring layer 20 may be selected from the range of 1 mm or more and 10 mm or less, preferably 1.5 mm or more and 5 mm or less.

Each mesh wiring layer 20 includes metal lines that form a grid structure or a mesh structure having a pattern periodic in the X direction and the Y direction. In other words, each mesh wiring layer 20 has a pattern including portions extending in the X direction (second-direction wiring lines 22) and portions extending in the Y direction (first-direction wiring lines 21).

Figure 2:
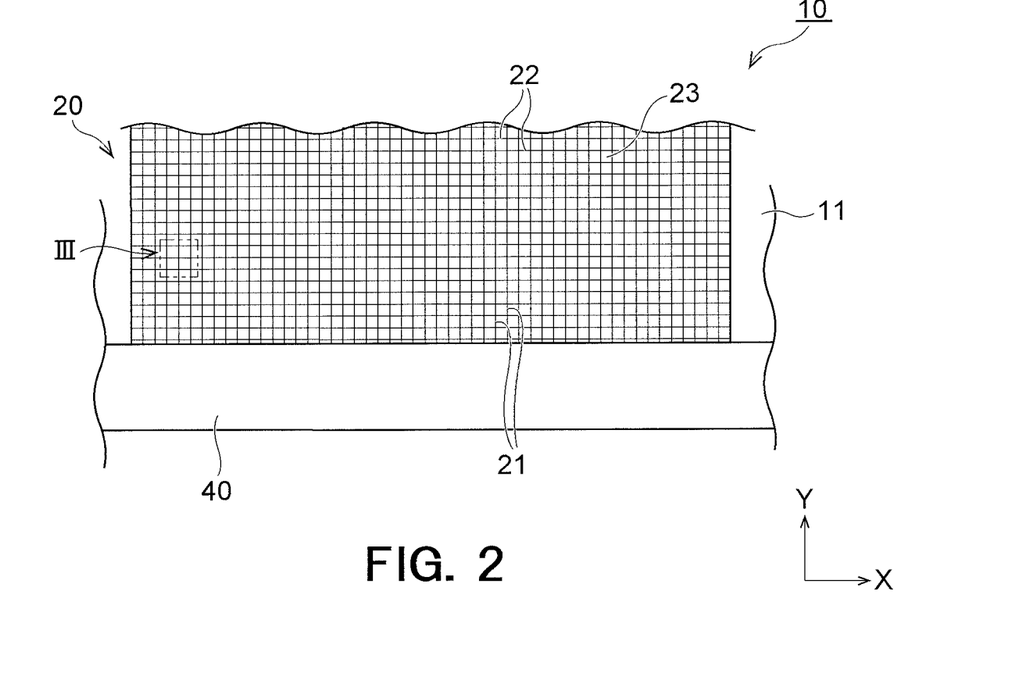
FIG. 2 is an enlarged plan view of the wiring board according to the embodiment (enlarged view of part II in FIG. 1).

As illustrated in FIG. 2, each mesh wiring layer 20 includes the first-direction wiring lines (antenna wiring lines) 21 that provide the function of an antenna and the second-direction wiring lines (antenna-connecting wiring lines) 22 that connect the first-direction wiring lines 21. More specifically, the first-direction wiring lines 21 and the second-direction wiring lines 22 are integrated together to form a grid structure or a mesh structure. Each first-direction wiring line 21 extends in a direction corresponding to the frequency band of the antenna (longitudinal direction, Y direction), and each second-direction wiring line 22 extends in a direction orthogonal to the first-direction wiring lines 21 (width direction, X direction). The first-direction wiring lines 21 have the length $L_a$ corresponding to a predetermined frequency band (above-described length of the mesh wiring layer 20, see FIG. 1) to mainly provide the function of an antenna. The second-direction wiring lines 22 connect the first-direction wiring lines 21 to each other to suppress defects such as breakage of the first-direction wiring lines 21 or electrical disconnection between each first-direction wiring line 21 and the feeding unit 40.

Figure 3:
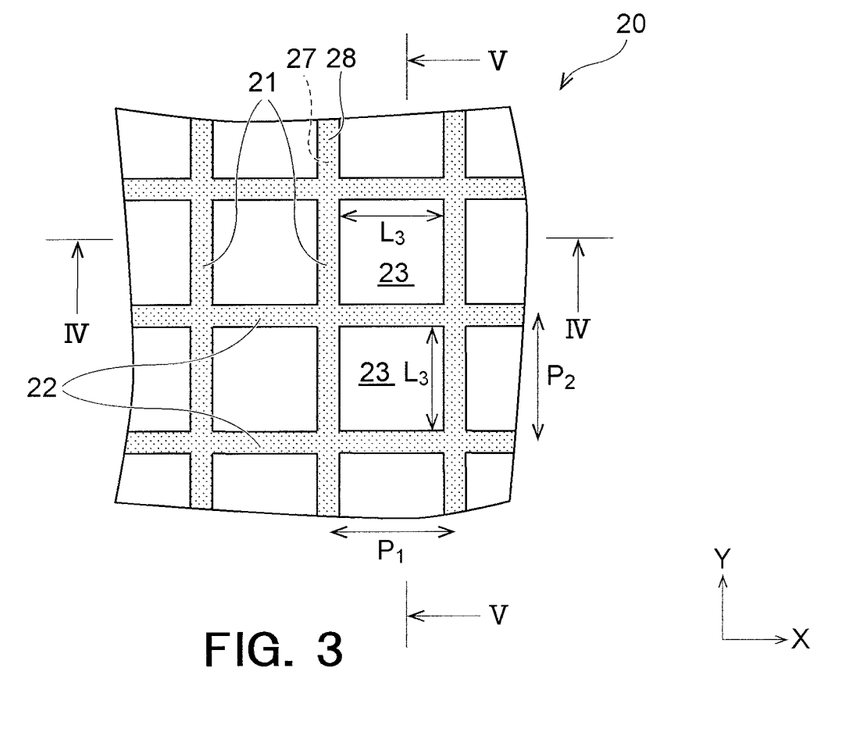
FIG. 3 is an enlarged plan view of the wiring board according to the embodiment (enlarged view of part III in FIG. 2).

As illustrated in FIG. 3, each mesh wiring layer 20 has a plurality of openings 23 that are each surrounded by adjacent ones of the first-direction wiring lines 21 and adjacent ones of the second-direction wiring lines 22. The first-direction wiring lines 21 and the second-direction wiring lines 22 are arranged at equal intervals. More specifically, the first-direction wiring lines 21 are arranged at equal intervals, and a pitch $P_1$ thereof may be in the range of, for example, 0.01 mm or more and 1 mm or less. The second-direction wiring lines 22 are arranged at equal intervals, and a pitch $P_2$ thereof may be in the range of, for example, 0.01 mm or more and 1 mm or less. Since the first-direction wiring lines 21 and the second-direction wiring lines 22 are both arranged at equal intervals as described above, differences in size between the openings 23 can be reduced in each mesh wiring layer 20, so that the mesh wiring layer 20 is not readily visible to the naked eye. The pitch $P_1$ of the first-direction wiring lines 21 is equal to the pitch $P_2$ of the second-direction wiring lines 22. The openings 23 are substantially square in plan view, and the substrate 11, which is transparent, is exposed at each opening 23. Therefore, the overall transparency of the wiring board 10 can be increased by increasing the area of each opening 23. A length $L_3$ of each side of each opening 23 may be in the range of, for example, 0.01 mm or more and 1 mm or less. Each first-direction wiring line 21 and each second-direction wiring line 22 are orthogonal to each other, but may instead cross each other at an acute or obtuse angle. The openings 23 preferably have the same shape and the same size over the entire region, but the shapes and sizes thereof may vary depending on the location and are not necessarily the same over the entire region.

Figure 4:
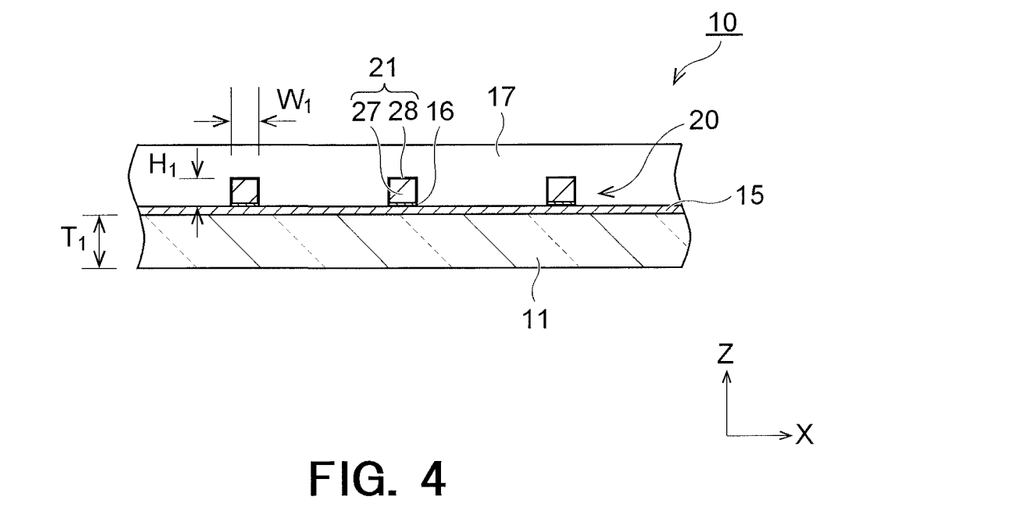
FIG. 4 is a sectional view of the wiring board according to the embodiment (sectional view of line VI-VI in FIG. 3).
Figure 5:
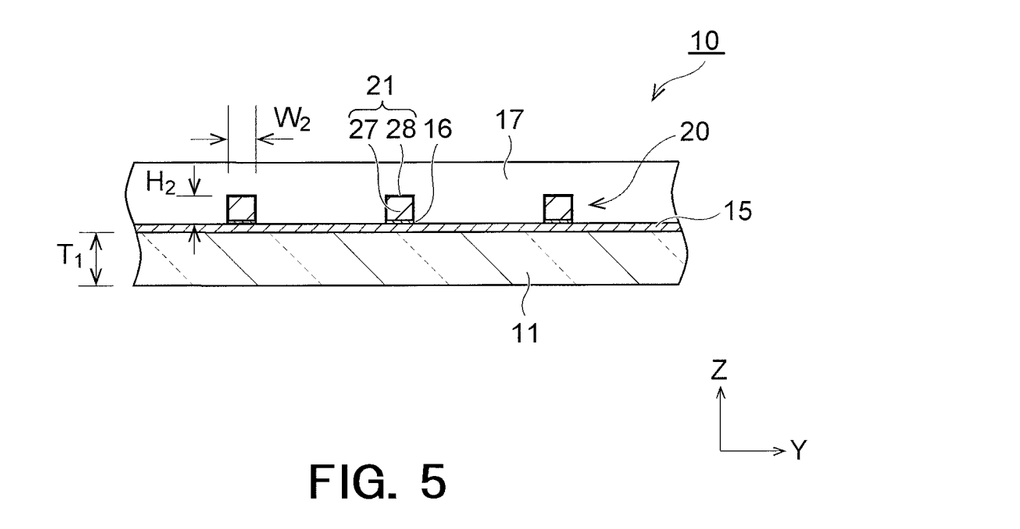
FIG. 5 is a sectional view of the wiring board according to the embodiment (sectional view of line V-V in FIG. 3).

As illustrated in FIG. 4, each first-direction wiring line 21 has a substantially rectangular or square cross section in a direction perpendicular to the longitudinal direction thereof (cross section in the X direction). The cross-sectional shape of each first-direction wiring line 21 is substantially uniform in the longitudinal direction of the first-direction wiring line 21 (Y direction). As illustrated in FIG. 5, each second-direction wiring line 22 has a substantially rectangular or square cross section in a direction perpendicular to the longitudinal direction thereof (cross section in the Y direction). The cross-sectional shape of each second-direction wiring line 22 is substantially the same as the above-described cross-sectional shape of each first-direction wiring line 21 (shape of cross section in the X direction). The cross-sectional shape of each second-direction wiring line 22 is substantially uniform in the longitudinal direction of the second-direction wiring line 22 (X direction). The cross-sectional shapes of each first-direction wiring line 21 and each second-direction wiring line 22 are not necessarily substantially rectangular or square, and may be, for example, a substantially trapezoidal shape that is narrower at the front side (side facing in the positive Z direction) than at the back side (side facing in the negative Z direction), or a shape having curved side surfaces at both ends in the longitudinal direction.

In the present embodiment, a line width $W_1$ (dimension in the X direction, see FIG. 4) of the first-direction wiring lines 21 and a line width $W_2$ (dimension in the Y direction, see FIG. 5) of the second-direction wiring lines 22 are not particularly limited, and may be selected as appropriate depending on the use. For example, the line width $W_1$ of the first-direction wiring lines 21 may be selected from the range of 0.1 μm or more and 5.0 μm or less. The line width $W_2$ of the second-direction wiring lines 22 may be selected from the range of 0.1 μm or more and 5.0 μm or less. A height $H_1$ (dimension in the Z direction, see FIG. 4) of the first-direction wiring lines 21 and a height $H_2$ (dimension in the Z direction, see FIG. 5) of the second-direction wiring lines 22 are not particularly limited, and may be selected as appropriate depending on the use. For example, the heights $H_1$ and $H_2$ may be selected from the range of 0.1 μm or more and 5.0 μm or less.

Figure 6:
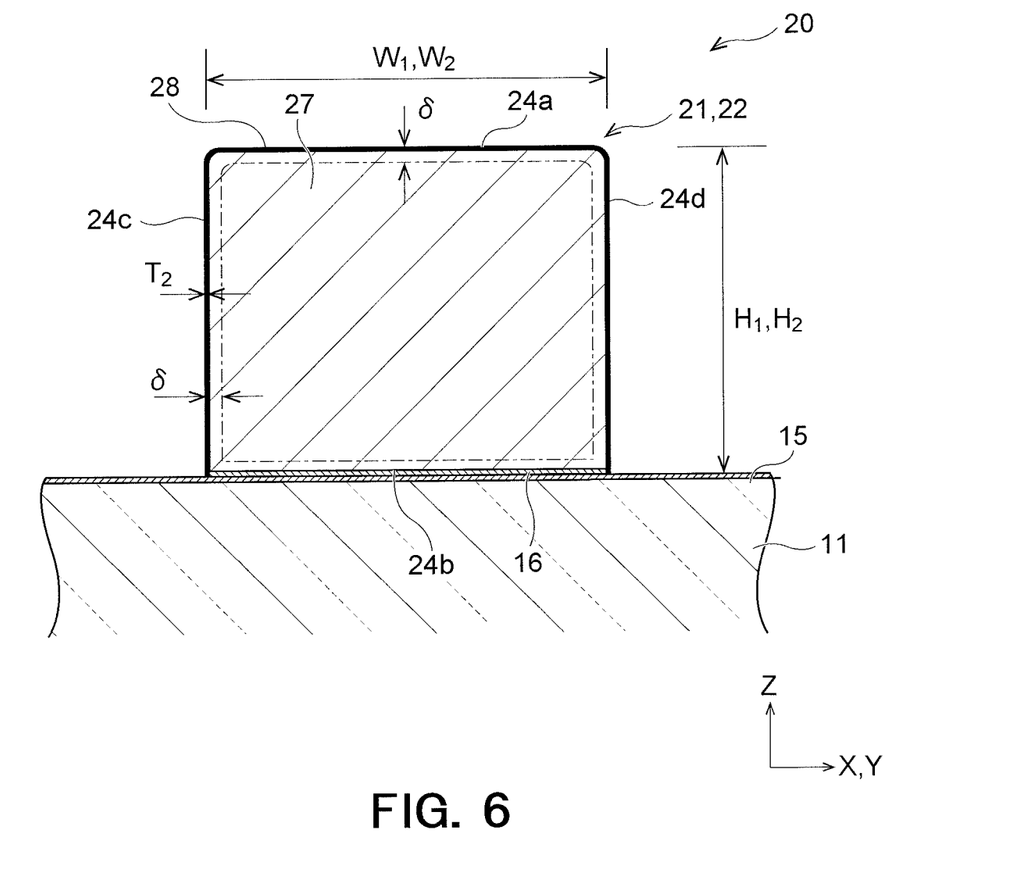
FIG. 6 is a sectional view of a first-direction wiring line and a second-direction wiring line.

FIG. 6 illustrates a cross section of each of the first-direction wiring lines 21 and the second-direction wiring lines 22 taken in the width direction (X direction, Y direction). Each of the first-direction wiring lines 21 and the second-direction wiring lines 22 has a front surface 24a, a back surface 24b, and two side surfaces 24c and 24d. The front surface 24a is positioned at a side of the first-direction wiring lines 21 and the second-direction wiring lines 22 viewed by a viewer during use (side facing in the positive Z direction). The back surface 24b is positioned opposite to the front surface 24a at a side facing the substrate 11 (side facing in the negative Z direction). The two side surfaces 24c and 24d are positioned between the front surface 24a and the back surface 24b at both sides of each of the first-direction wiring lines 21 and the second-direction wiring lines 22 in the width direction (X direction, Y direction). In this case, the front surface 24a is substantially orthogonal to the side surfaces 24c and 24d, and the back surface 24b is also substantially orthogonal to the side surfaces 24c and 24d. However, the surfaces are not limited to this, and may cross each other at an acute or obtuse angle. The front surface 24a, the back surface 24b, and the side surfaces 24c and 24d extend straight. However, the front surface 24a, the back surface 24b, and the side surfaces 24c and 24d are not limited to this, and may instead be curved.

As illustrated in FIG. 6, each of the first-direction wiring lines 21 and the second-direction wiring lines 22 includes a metal layer 27 and a blackened layer (first layer) 28 disposed on the metal layer 27. The metal layer 27 constitutes the main portion of each of the first-direction wiring lines 21 and the second-direction wiring lines 22, and is positioned at the center of each of the first-direction wiring lines 21 and the second-direction wiring lines 22. The blackened layer 28 is formed on the outer periphery of the metal layer 27, and defines the outermost surface of each of the first-direction wiring lines 21 and the second-direction wiring lines 22.

The material of the metal layer 27 may be any conductive metal material. In the present embodiment, the material of the metal layer 27 is copper. However, the material is not limited to this. Examples of the material of the metal layer 27 include metal materials (including alloys), such as gold, silver, copper, platinum, tin, aluminum, iron, and nickel.

The blackened layer 28 is formed to cover the outer surface of the metal layer 27. The blackened layer 28 is formed on the metal layer 27 at each of the front surface 24a and the side surfaces 24c and 24d. The blackened layer 28 is preferably formed to extend over the entire regions of the front surface 24a and the side surfaces 24c and 24d. The blackened layer 28 is not formed on the metal layer 27 at the back surface 24b. The overall color of the blackened layer 28 is black, and the blackened layer 28 reflects less visible light than the metal layer 27. The black color is not limited to achromatic black, and includes dark gray, chromatic black, and chromatic dark gray.

The material of the blackened layer 28 is preferably a black metal material, and may contain, for example, palladium or tellurium. As described below, the palladium or tellurium may be provided by subjecting the metal layer 27 to a replacement process. More specifically, the metal layer 27 may be subjected to a replacement process in which metal atoms on the outer surface thereof are replaced with atoms of palladium or tellurium. Alternatively, as described below, the blackened layer 28 may be formed by subjecting the metal layer 27 to an oxidation process. More specifically, the outer surface of the metal layer 27 may be subjected to an oxidation process by using blackening liquid so that the blackened layer 28, which is an oxidized film obtained as a result of oxidation of the metal layer 27, is formed on the outer surface of the metal layer 27. In other words, the blackened layer 28 may contain an oxide of metal that forms the metal layer 27. When, for example, the material of the metal layer 27 is copper, the blackened layer 28 may contain copper oxide.

The blackened layer 28 has a thickness $T_2$ of 5 nm or more. The thickness $T_2$ may be 10 nm or more, preferably 20 nm or more. When the thickness $T_2$ of the blackened layer 28 is 5 nm or more, the metal layer 27 is sufficiently covered with the blackened layer 28, so that visible light can be sufficiently absorbed by the blackened layer 28. Accordingly, reflection of visible light by the blackened layer 28 can be suppressed so that the mesh wiring layer 20 is not readily visible to the naked eye. In the present embodiment, visible light means light with a wavelength of 380 nm or more and 750 nm or less.

The thickness $T_2$ of the blackened layer 28 is 100 nm or less, preferably 60 nm or less. When the thickness $T_2$ of the blackened layer 28 is 100 nm or less, reduction in conductivity of the mesh wiring layer 20 due to the presence of the blackened layer 28 can be suppressed. Accordingly, reduction in current flow through the mesh wiring layer 20 can be suppressed during transmission and reception of radio waves.

The thickness $T_2$ of the blackened layer 28 may be measured by the method of scanning transmission electron microscopy-energy dispersive X-ray spectroscopy (STEM-EDS). More specifically, the thickness $T_2$ of the blackened layer 28 may be measured as follows.

First, before carrying out the STEM-EDS method, a test piece is subjected to preprocessing in which a cross section thereof is processed by a focus ion beam (FIB) method. In this case, before carrying out the FIB method, the test piece is subjected to preprocessing in which carbon is applied to the surface thereof to a thickness of 200 nm or more to form a protective film. The protective film may be made of, for example, Pt, PtPd, or Os instead of carbon. The protective film may be formed by, for example, sputtering or vapor deposition. The protective film suppresses damage to the surface of a portion processed in the process by the FIB method, and the thickness thereof may be adjusted as appropriate by adjusting processing conditions. An FIB device that is used may be any device as long as the device has a system capable of performing a process, such as microsampling, for picking up a sample from any location. For example, NB5000 manufactured by Hitachi High-Technologies Corporation may be used. The finishing thickness of a thin film formed on the cross section of the observed portion may be 50 nm to 150 nm.

The STEM-EDS method is preferably carried out by an STEM-EDS device in which an acceleration voltage is 200 kV or more, which not only performs transmission electron microscope (TEM) observation but also includes an STEM system, and which is provided with a cold electron gun or a Schottky electron gun instead of a tungsten electron gun. For example, JEM-2100F manufactured by JEOL Ltd. may be used. When the blackened layer 28 can be clearly observed by TEM observation, length measurement is performed on a TEM image. When the blackened layer 28 cannot be clearly observed by TEM observation, STEM-EDS is performed. When the blackened layer 28 contains palladium or tellurium, a region in which palladium or tellurium is present may be measured on a mapping image. When the blackened layer 28 contains copper oxide, a region in which oxygen is present may be measured on a mapping image. When the amount of detection is small, line scanning, for example, may be performed, and the location corresponding to the half-width may be determined as the interface. The thickness $T_2$ of the blackened layer 28 is measured at a location separated from the ends of the cross section of the first-direction wiring lines 21 and the second-direction wiring lines 22 in the width direction thereof. For example, when the upper surface of one of the first-direction wiring lines 21 and the second-direction wiring lines 22 is measured, the measurement is performed at a location close to the center and separated from the ends in the width direction by a distance of 10% or more of the width of the first-direction wiring lines 21 and the second-direction wiring lines 22. When a side surface of one of the first-direction wiring lines 21 and the second-direction wiring lines 22 is measured, the measurement is performed at a location close to the center and separated from the ends in the thickness direction by a distance of 10% or more of the thickness of the first-direction wiring lines 21 and the second-direction wiring lines 22. The measurement may be performed at one location, but may also be performed at a certain number of locations, and the average of the measurement results may be calculated.

As illustrated in FIGS. 4 and 5, an easily adhesive layer 15 is formed on the substrate 11. The easily adhesive layer 15, which increases adhesion between the substrate 11 and each of the first-direction wiring lines 21 and the second-direction wiring lines 22, is formed on the front surface of the substrate 11 over substantially the entire region thereof. The easily adhesive layer 15 is composed of an insulating film. The material of the easily adhesive layer 15 may be a colorless transparent resin, for example, an acrylic resin such as polymethyl (meth)acrylate, polyethyl (meth)acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. The thickness of the easily adhesive layer 15 may be set as appropriate in the range of 10 nm or more and 800 nm or less. The easily adhesive layer 15 may be formed on the front surface of the substrate 11 at least over each mesh wiring layer 20.

An adhesion enhancing layer 16 is formed on the easily adhesive layer 15. The adhesion enhancing layer 16 is located between the easily adhesive layer 15 and each of the first-direction wiring lines 21 and the second-direction wiring lines 22. The adhesion enhancing layer 16, which enhances the adhesion between the substrate 11 and each of the first-direction wiring lines 21 and the second-direction wiring lines 22, has the same shape as that of the first-direction wiring lines 21 and the second-direction wiring lines 22 in plan view. In other words, the adhesion enhancing layer 16 has a grid structure or a mesh structure in plan view. The material of the adhesion enhancing layer 16 may be, for example, titanium, titanium oxide, nickel, nickel oxide, or a metal oxide such as indium zinc oxide (IZO). The thickness of the adhesion enhancing layer 16 may be selected from the range of 10 nm or more and 100 nm or less. It is not necessary that the adhesion enhancing layer 16 be provided.

A protective layer 17 is formed on the front surface of the substrate 11 so as to cover the first-direction wiring lines 21, the second-direction wiring lines 22, and the easily adhesive layer 15. The protective layer 17, which protects the first-direction wiring lines 21 and the second-direction wiring lines 22, is formed on the front surface of the substrate 11 over substantially the entire region thereof. The material of the protective layer 17 may be a colorless transparent insulating resin, for example, an acrylic resin such as polymethyl (meth)acrylate, polyethyl (meth)acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. The thickness of the protective layer 17 may be selected from the range of 0.3 µm or more and 10 µm or less. The protective layer 17 may be formed on the substrate 11 to at least cover each mesh wiring layer 20.

It is not necessary that all of the easily adhesive layer 15, the adhesion enhancing layer 16, and the protective layer 17 be provided. For example, the easily adhesive layer 15 and the protective layer 17 may be provided, and the adhesion enhancing layer 16 may be omitted. Alternatively, the adhesion enhancing layer 16 may be provided, and the easily adhesive layer 15 and the protective layer 17 may be omitted.

An overall opening ratio At of the mesh wiring layer 20 may be in the range of, for example, 87% or more and less than 100%. When the overall opening ratio At of the wiring board 10 is in this range, the wiring board 10 may be sufficiently conductive and transparent. The opening ratio is a ratio (%) of the area of the opening region (region in which metal portions, such as the first-direction wiring lines 21 and the second-direction wiring lines 22, are not present and in which the substrate 11 is exposed) to the unit area in a predetermined region (for example, the entire region of the mesh wiring layer 20).

Referring to FIG. 1 again, the feeding unit 40 is electrically connected to the mesh wiring layers 20. The feeding unit 40 is composed of a substantially rectangular thin plate-shaped conductive member. The longitudinal direction of the feeding unit 40 is parallel to the X direction, and the transverse direction of the feeding unit 40 is parallel to the Y direction. The feeding unit 40 is disposed at an end of the substrate 11 in the longitudinal direction of the substrate 11 (end in the negative Y direction). Examples of the material of the feeding unit 40 include metal materials (including alloys), such as gold, silver, copper, platinum, tin, aluminum, iron, and nickel. The feeding unit 40 is electrically connected to a wireless communication circuit 92 of an image display device 90 (see FIG. 9) when the wiring board 10 is installed in the image display device 90. Although the feeding unit 40 is provided on the front surface of the substrate 11, the feeding unit 40 is not limited to this, and a portion or the entirety thereof may instead be located outside the peripheral edge of the substrate 11. When the feeding unit 40 is formed to be flexible, the feeding unit 40 may be formed to extend to a side surface or a back surface of the image display device 90 to provide electrical connection at the side surface or the back surface.

[Method for Manufacturing Wiring Board]

A method for manufacturing a wiring board according to the present embodiment will now be described with reference to FIGS. 7A to 7E and FIGS. 8A to 8F. FIGS. 7A to 7E and FIGS. 8A to 8F are sectional views illustrating the method for manufacturing the wiring board according to the present embodiment.

Figure 7A:
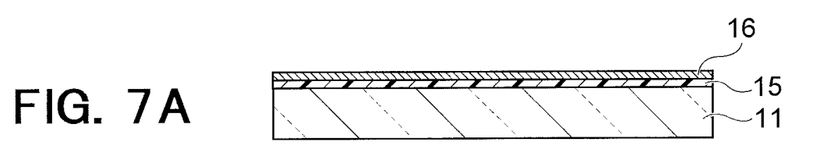
FIGS. 7A to 7E are sectional views illustrating a method for manufacturing the wiring board according to the embodiment.

First, as illustrated in FIG. 7A, the substrate 11 is prepared, and the easily adhesive layer 15 and the adhesion enhancing layer 16 are successively formed on the front surface of the substrate 11 over substantially the entire region thereof. The easily adhesive layer 15 may be formed by, for example, roll coating, gravure coating, gravure reverse coating, micro gravure coating, slot die coating, die coating, knife coating, inkjet coating, dispenser coating, kiss coating, or spray coating. The adhesion enhancing layer 16 may be formed by, for example, vapor deposition, sputtering, or plasma CVD.

Figure 7B:
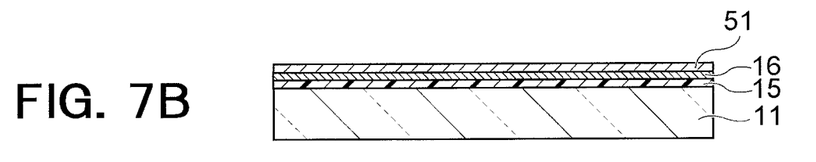

Next, as illustrated in FIG. 7B, a conductive layer 51 is formed on the adhesion enhancing layer 16 over substantially the entire region of the front surface of the substrate 11. In the present embodiment, the thickness of the conductive layer 51 is 200 nm. However, the thickness of the conductive layer 51 is not limited to this, and may be selected as appropriate from the range of 10 nm or more and 1000 nm or less. In the present embodiment, the conductive layer 51 is formed by sputtering by using copper. The conductive layer 51 may instead be formed by, for example, plasma CVD.

Figure 7C:
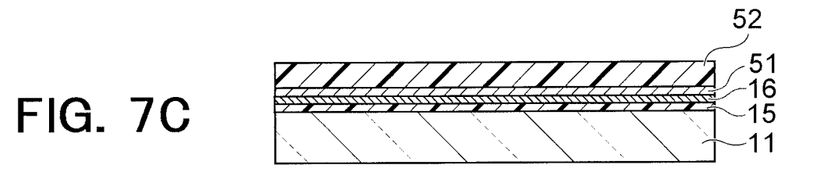

Next, as illustrated in FIG. 7C, a photocurable insulating resist 52 is applied to the conductive layer 51 over substantially the entire region of the front surface of the substrate 11. The photocurable insulating resist 52 may be, for example, an organic resin, such as an epoxy-based resin.

Figure 7D:
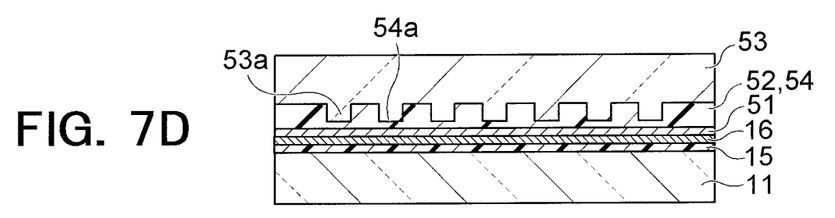

Subsequently, a transparent imprinting mold 53 having projections 53a is prepared (see FIG. 7D). This mold 53 is brought closer to the substrate 11 so that the photocurable insulating resist 52 spreads between the mold 53 and the substrate 11. Next, the photocurable insulating resist 52 is exposed to light through the mold 53 to cure the photocurable insulating resist 52, so that an insulating layer 54 is formed. Thus, trenches 54a having shapes obtained by transferring the shapes of the projections 53a are formed on the front surface of the insulating layer 54. The trenches 54a have a pattern corresponding to the first-direction wiring lines 21 and the second-direction wiring lines 22 in plan view.

Figure 7E:
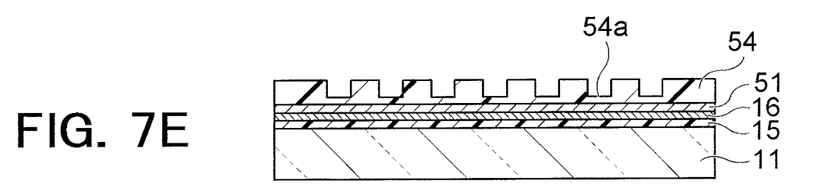

After that, the mold 53 is separated from the insulating layer 54, so that the insulating layer 54 having a cross-sectional structure illustrated in FIG. 7E is obtained. The direction in which the mold 53 is separated from the insulating layer 54 is preferably the Y direction in which the first-direction wiring lines 21, which are the longer wiring lines, extend.

Since the trenches 54a are formed on the front surface of the insulating layer 54 by imprinting, the trenches 54a can be formed in a fine shape. The method for forming the insulating layer 54 is not limited to this, and the insulating layer 54 may instead be formed by photolithography. In such a case, a resist pattern is formed by photolithography so that portions of the conductive layer 51 that correspond to the first-direction wiring lines 21 and the second-direction wiring lines 22 are exposed.

An insulating material may remain at the bottom of the trenches 54a in the insulating layer 54. Therefore, the remaining insulating material is removed by a wet process using a permanganate solution or an organic solvent, such as N-Methyl-2-pyrrolidone, or a dry process using an oxygen plasma.

Figure 8A:
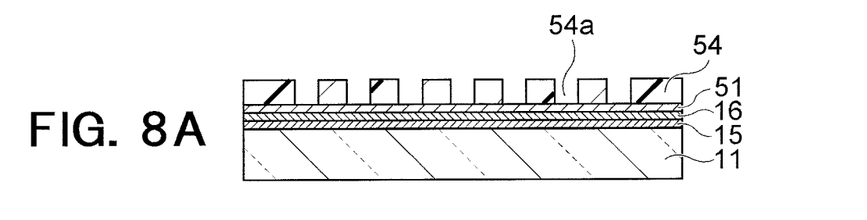
FIGS. 8A to 8F are sectional views illustrating the method for manufacturing the wiring board according to the embodiment.

By removing the remaining insulating material as described above, the trenches 54a at which the conductive layer 51 is exposed are formed as illustrated in FIG. 8A.

Figure 8B:
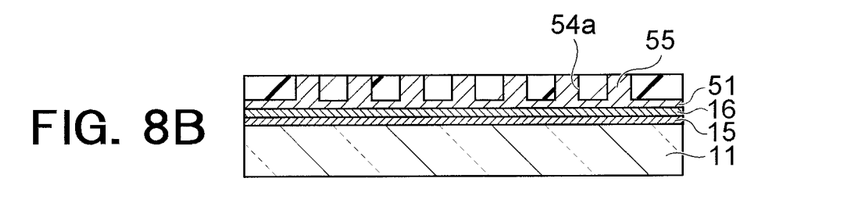

Next, as illustrated in FIG. 8B, the trenches 54a in the insulating layer 54 are filled with a conductor 55. In the present embodiment, the trenches 54a in the insulating layer 54 are filled with copper by electroplating by using the conductive layer 51 as a seed layer.

Figure 8C:
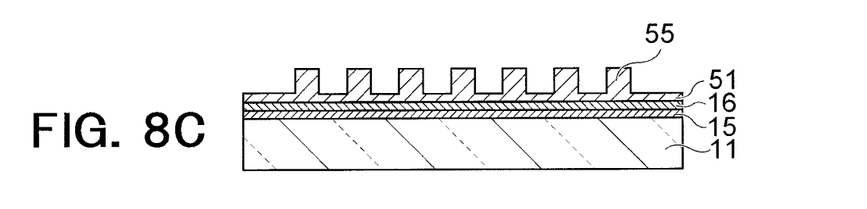

Next, as illustrated in FIG. 8C, the insulating layer 54 is removed. The insulating layer 54 on the substrate 11 is removed by a wet process using a permanganate solution or an organic solvent, such as N-Methyl-2-pyrrolidone, or a dry process using an oxygen plasma.

Figure 8D:
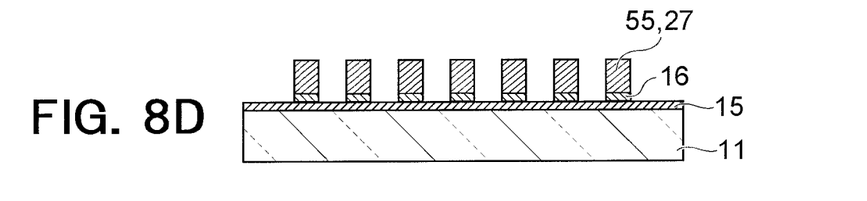

Next, as illustrated in FIG. 8D, the conductive layer 51 and the adhesion enhancing layer 16 on the front surface of the substrate 11 are removed. The conductive layer 51 and the adhesion enhancing layer 16 are etched so that the front surface of the substrate 11 is exposed by a wet process using a copper etching solution, such as an aqueous solution of ferric chloride, an aqueous solution of cupric chloride, an aqueous solution of ammonium peroxodisulfate, an aqueous solution of sodium peroxodisulfate, sulfuric acid, or aqueous hydrogen peroxide.

Figure 8E:
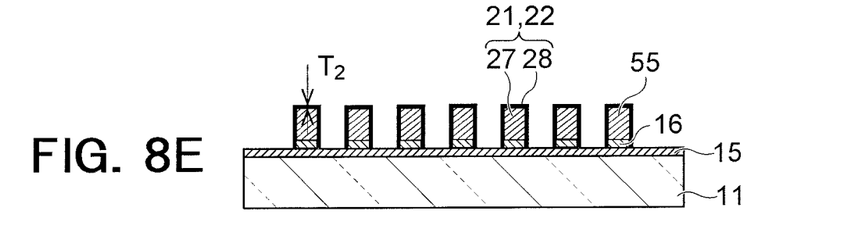

Next, as illustrated in FIG. 8E, the blackened layer 28 is formed on the outer periphery of the conductor 55 (metal layer 27) on the front surface of the substrate 11. The blackened layer 28 is formed so that the thickness $T_2$ thereof is 5 nm or more and 100 nm or less.

In this case, the outer periphery of the metal layer 27 may be subjected to a replacement process to form the blackened layer 28 containing palladium or tellurium.

The replacement process is a process in which metal atoms on the outer periphery of the metal layer 27 are replaced with metal atoms of palladium or tellurium by utilizing the difference in ionization tendency between these metal atoms. Assuming, for example, that the material of the metal layer 27 is copper, which is a metal having a high ionization tendency, the copper is immersed in an aqueous solution containing metal ions of palladium or tellurium, which have a low ionization tendency. Accordingly, the copper dissolves into metal ions and releases electrons. The electrons reduce the palladium or tellurium so that the palladium or tellurium is deposited on the metal layer 27.

When the blackened layer 28 contains palladium, the above-described aqueous solution preferably contains palladium at a concentration of 0.01 g/L or more and 10 g/L or less, and is preferably an acid solution containing nitric or sulfuric acid and chelate so that palladium is uniformly dissolved. When the blackened layer 28 contains tellurium, the above-described aqueous solution preferably contains tellurium at a concentration of 0.01 g/L or more and 10 g/L or less, and is preferably an acid solution containing nitric or sulfuric acid so that tellurium is uniformly dissolved. The thickness $T_2$ of the blackened layer 28 can be adjusted to 5 nm or more and 100 nm or less by appropriately setting, for example, the time for which the metal layer 27 is immersed in the aqueous solution, the temperature of the aqueous solution, and the concentration of palladium or tellurium in the aqueous solution.

The blackened layer 28 may instead be formed by subjecting the outer periphery of the metal layer 27 to an oxidation process.

The oxidation process is a process in which the outer periphery of the metal layer 27 is oxidized to form a metal oxide on the outer periphery of the metal layer 27, so that the surface of the metal layer 27 is blackened. In this case, oxidizing liquid that is used may be, for example, a mixed aqueous solution of hypochlorite and sodium hydroxide, a mixed aqueous solution of chlorite and sodium hydroxide, or a mixed aqueous solution of peroxydisulfuric acid and sodium hydroxide. The thickness $T_2$ of the blackened layer 28 can be adjusted to 5 nm or more and 100 nm or less by appropriately setting, for example, the time for which the metal layer 27 is immersed in the oxidizing liquid, the temperature of the oxidizing liquid, and concentrations of components of the oxidizing liquid.

Figure 8F:
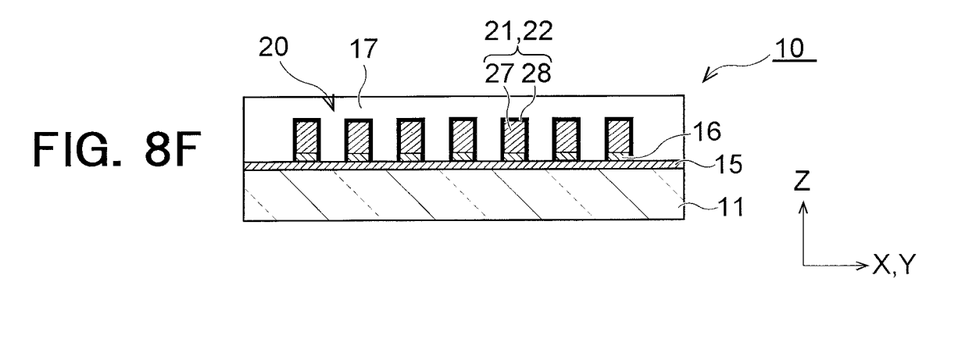

After that, as illustrated in FIG. 8F, the protective layer 17 is formed to cover the easily adhesive layer 15 and the blackened layer 28 on the substrate 11. The protective layer 17 may be formed by, for example, roll coating, gravure coating, gravure reverse coating, micro gravure coating, slot die coating, die coating, knife coating, inkjet coating, dispenser coating, kiss coating, spray coating, screen printing, offset printing, or flexographic printing.

Thus, the wiring board 10 including the substrate 11 and the mesh wiring layers 20 arranged on the substrate 11 is obtained (FIG. 8E). The mesh wiring layers 20 each include the first-direction wiring lines 21 and the second-direction wiring lines 22. Each of the first-direction wiring lines 21 and the second-direction wiring lines 22 includes the metal layer 27 and the blackened layer 28 formed on the outer periphery of the metal layer 27. The feeding unit 40 may be formed of a portion of the conductor 55. Alternatively, a flat plate-shaped feeding unit 40 may be separately prepared, and the thus-prepared feeding unit 40 may be electrically connected to the mesh wiring layers 20.

Operations of Present Embodiment

The operations of the wiring board having the above-described structure will now be described.

Figure 9:
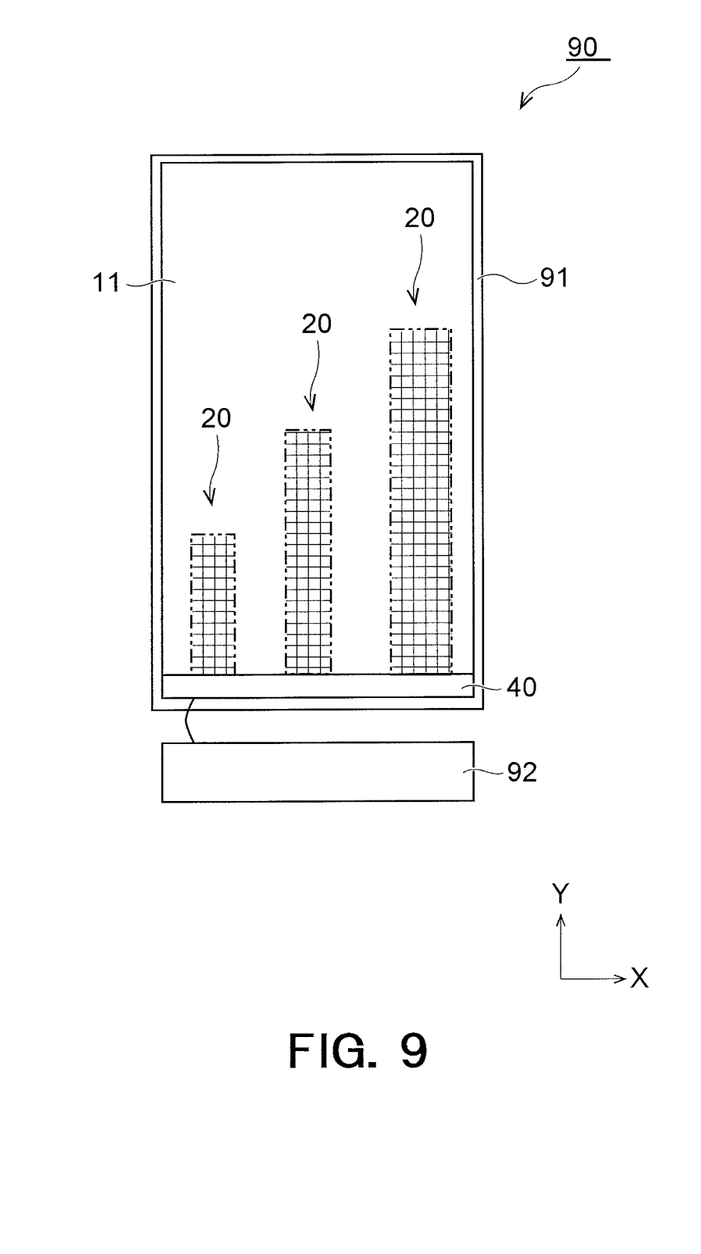
FIG. 9 is a plan view of an image display device according to an embodiment.

As illustrated in FIG. 9, the wiring board 10 is installed in the image display device 90 having the display 91. The wiring board 10 is disposed on the display 91. The image display device 90 may be, for example, a portable terminal device, such as a smartphone or a tablet. The mesh wiring layers 20 of the wiring board 10 are electrically connected to the wireless communication circuit 92 of the image display device 90 through the feeding unit 40. Thus, radio waves of predetermined frequencies can be transmitted and received through the mesh wiring layers 20. This enables communication using the image display device 90. When the image display device 90 includes a polarizing plate, the wiring board 10 is preferably disposed closer to the viewer than the polarizing plate.

As described above, according to the present embodiment, each of the first-direction wiring lines 21 and the second-direction wiring lines 22 includes the metal layer 27 and the blackened layer 28 formed on the outer periphery of the metal layer 27, and the thickness $T_2$ of the blackened layer 28 is 5 nm or more and 100 nm or less. Accordingly, the blackened layer 28 absorbs visible light, so that reflection of the visible light by the metal layer 27 can be suppressed. As a result, the visibility of the mesh wiring layers 20 on the front surface of the display 91 can be reduced, so that the mesh wiring layers 20 are not readily visible to the naked eye of the viewer. Since the thickness $T_2$ of the blackened layer 28 is as small as 100 nm or less, the resistance of the first-direction wiring lines 21 and the second-direction wiring lines 22 is not greatly increased due to the presence of the blackened layer 28. Accordingly, current flow through the first-direction wiring lines 21 and the second-direction wiring lines 22 can be facilitated during transmission and reception of radio waves.

In addition, in recent years, mobile terminal devices for fifth-generation (5G) communications have been developed. When the mesh wiring layers 20 of the wiring board 10 are used as, for example, 5G antennas (in particular, millimeter wave antennas), the frequency of radio waves (millimeter waves) transmitted and received by the mesh wiring layers 20 is higher than that of radio waves transmitted and received by, for example, 4G antennas. In general, when an alternating current is applied to a wiring line, the current flow in a central region of the wiring line is reduced as the frequency is increased. Accordingly, the current flows along the surface of the wiring line. The phenomenon in which an alternating current applied to a wiring line flows only along the surface of the wiring line is referred to as the skin effect. A skin depth is the depth from the surface of the wiring line at which the current is reduced to 1/e (about 0.37) times the current along the surface of the wiring line at which the current most easily flows. In general, the skin depth δ can be determined by the following equation.

$$\delta = \sqrt{\frac{2}{\omega \mu \sigma}} \qquad \text{[Math. 1]}$$

In the above equation, ω is the angular frequency (=2πf), μ is the permeability (4π×10$^{-7}$ [H/m] in vacuum), and σ is the conductivity of the conductor that forms the wiring lines (5.8×10$^7$ [S/m] for copper). The skin depth δ of the wiring lines made of copper is about 2.3 μm when the frequency is 0.8 GHz, about 1.3 μm when the frequency is 2.4 GHz, about 1.0 μm when the frequency is 4.4 GHz, and about 0.85 μm when the frequency is 6 GHz. The frequency of radio waves (millimeter waves) transmitted and received by a 5G antenna (28 GHz to 39 GHz) is higher than the frequency of radio waves transmitted and received by, for example, a 4G antenna. When, for example, the frequency of the current is 28 GHz to 39 GHz, δ is about 0.3 μm to about 0.4 μm.

In the present embodiment, the thickness $T_2$ of the blackened layer 28, which has a high electrical resistivity, is 100 nm or less. Thus, the thickness $T_2$ of the blackened layer 28 is sufficiently smaller than the skin depth δ. Accordingly, the current flow through the mesh wiring layers 20 is not impeded by the blackened layer 28 having a high electrical resistivity. Conversely, since most of the portion through which the current easily flows is the metal layer 27, and the conductivity of this portion can be increased. When the mesh wiring layers 20 are used as antennas, the performance of the antennas can be maintained. In particular, when the mesh wiring layers 20 transmit and receive radio waves (millimeter waves), since the thickness $T_2$ of the blackened layer 28 is 100 nm or less, the thickness $T_2$ is sufficiently smaller than the skin depth δ of the copper wiring lines.

Therefore, the current flow through the mesh wiring layers 20 is not impeded by the blackened layer 28.

In addition, in the present embodiment, the blackened layer 28 may contain palladium or tellurium. Therefore, the conductivity of the blackened layer 28 is low, and the current flow through the mesh wiring layers 20 is not impeded.

In addition, in the present embodiment, the blackened layer 28 may be formed by subjecting the metal layer 27 to an oxidation process. Accordingly, the metal layer 27 can be protected by the blackened layer 28, and rusting of the metal layer 27 can be suppressed.

In addition, according to the present embodiment, the dielectric loss tangent of the substrate 11 is 0.002 or less. Accordingly, when high-frequency radio waves (millimeter waves) are transmitted and received by the mesh wiring layers 20, dielectric loss can be reduced during transmission and reception of the radio waves.

In addition, according to the present embodiment, since the easily adhesive layer 15 is formed on the substrate 11, the adhesion between the substrate 11 and each of the first-direction wiring lines 21 and the second-direction wiring lines 22 can be increased. In addition, since the adhesion enhancing layer 16 is formed on the easily adhesive layer 15, the adhesion between the substrate 11 and each of the first-direction wiring lines 21 and the second-direction wiring lines 22 can be further enhanced.

In addition, according to the present embodiment, the protective layer 17 is formed on the substrate 11 so as to cover the first-direction wiring lines 21 and the second-direction wiring lines 22. Therefore, the first-direction wiring lines 21 and the second-direction wiring lines 22 can be protected from, for example, external impacts.

In addition, according to the present embodiment, each mesh wiring layer 20 has a function of an antenna. The mesh wiring layer 20 that functions as an antenna can be disposed on the outermost surface of the image display device 90. Therefore, the communication performance is higher than when an antenna is mounted in the image display device 90. In addition, since a plurality of mesh wiring layers 20 that function as antennas can be arranged along the surface of the image display device 90, the communication performance can be improved.

Although the mesh wiring layers 20 function as antennas in the example described in the present embodiment, the mesh wiring layers 20 are not limited to this. The mesh wiring layers 20 may instead have functions of, for example, hovering (function for enabling operation by the user without direct contact with a display), fingerprint authentication, heating, or noise filtering (shielding). Also in these cases, the visibility of the mesh wiring layers 20 can be reduced, and the current flow through the mesh wiring layers 20 can be facilitated.

In addition, although the blackened layer 28 is provided on both the first-direction wiring lines 21 and the second-direction wiring lines 22 in the example described in the present embodiment, the blackened layer 28 is not limited to this. The blackened layer 28 may instead be provided only on the first-direction wiring lines 21, or only on the second-direction wiring lines 22. Also, the blackened layer 28 may be provided on some of the first-direction wiring lines 21 and some of the second-direction wiring lines 22.

EXAMPLES

Examples of the present embodiment will now be described.

(Production of Mesh Pattern)

Wiring boards according to Examples 1 to 3 and Comparative Example were prepared as described below.

Example 1

A copper mesh pattern was formed on a substrate composed of a PET film and having a thickness of 100 µm, and the mesh pattern was subjected to a blackening process. The blackening process was performed by immersing the copper mesh pattern on the substrate in an electroless palladium plating solution for a predetermined time. After that, the mesh pattern subjected to the blackening process was cleaned with ion-exchanged water and dried. Thus, a wiring board including a substrate and a mesh wiring layer including a blackened layer was obtained. The mesh wiring layer had a size of 3 mm in width and 24 mm in length. The mesh wiring layer was grid-shaped, and the line width of the wiring lines was 1 µm in both the width direction and the length direction of the mesh wiring layer. The height of the wiring lines was 1 µm, and the pitch of the wiring lines was 100 µm. A solid pattern made of copper (3 mm in width and 1 mm in length) was formed at each end of the mesh wiring layer in the length direction for resistance measurement. The thickness of the blackened layer was 15 nm.

Example 2

A wiring board of Example 2 was produced similarly to Example 1 except that the thickness of the blackened layer was 60 nm.

Example 3

A wiring board of Example 3 was produced similarly to Example 1 except that the thickness of the blackened layer was 8 nm.

Comparative Example

A wiring board of Comparative Example was produced similarly to Example 1 except that no blackened layer was formed.

An L* value (color coordinate) and a resistance were measured for each of the wiring boards of Examples 1 to 3 and Comparative Example.

The L* value (color coordinate) was measured by using a spectral colorimeter (CM-700d manufactured by Konica Minolta, Inc.). The wiring lines were too thin for direct measurement of the L* value (color coordinate). Therefore, a copper thin film (film thickness 1 µm) having a size of 1 cm square or more was formed on a substrate composed of a PET film and having a thickness of 100 µm by sputtering. The thus-formed copper thin film was subjected to a blackening process under the same conditions as those in Examples 1 to 3 and Comparative Example, and then measured. The measurement conditions of the color coordinate were as follows:

Measurement Method: SCE method
Viewing Angle: 10°
Light Source: D65 light source A digital multimeter (CDM-2000D manufactured by Custom Corporation) was used to measure the resistance. The resistance between the solid patterns at both ends of the mesh wiring layer in the length direction was measured.

The thickness of the blackened layer was measured by the above-described method of scanning transmission electron microscopy-energy dispersive X-ray spectroscopy (STEM-EDS).

A wiring board with an L* value of 40 or less and a resistance less than or equal to a resistance that is 10% higher than that in Comparative Example (14.0Ω) was rated "good (O)". The results are shown in Table 1.

TABLE 1

| | Thickness of Blackened Layer | L* Value (Color Coordinate) | Resistance | Overall Rating |
|---|---|---|---|---|
| Example 1 | 15 nm | 39.1 | 14.5Ω | ○ |
| Example 2 | 60 nm | 17.2 | 15.2Ω | ○ |
| Example 3 | 8 nm | 39.8 | 14.4Ω | ○ |
| Comparative Example | — | 46.5 | 14.0Ω | — |

As shown in Table 1, each of the wiring boards according to Examples 1 to 3 had an L* value of 40 or less. Thus, reflection of visible light by the mesh wiring layer was suppressed. In addition, the mesh wiring layer of each of the wiring boards according to Examples 1 to 3 had a resistance that is not greatly higher than that of the mesh wiring layer of the wiring board according to Comparative Example.

The components of the above-described embodiment and modifications may be applied in combination with each other as necessary. Also, some of the components of the above-described embodiment and modifications may be omitted.

The invention claimed is:

1. A wiring board comprising:
   a substrate; and
   a mesh wiring layer disposed on the substrate and including a plurality of wiring lines,
   wherein the substrate has a transmittance of 85% or more for light with a wavelength of 380 nm or more and 750 nm or less,
   wherein each of the wiring lines includes a metal layer and a blackened layer disposed on the metal layer,
   wherein the blackened layer has a thickness of 5 nm or more and 100 nm or less, and
   wherein the blackened layer comprises an oxide of a metal contained in the metal layer.

2. The wiring board according to claim 1, wherein the blackened layer is obtained by subjecting the metal layer to an oxidation process.

3. The wiring board according to claim 1, wherein the mesh wiring layer is an antenna which transmits and receives radio waves of 28 GHz to 39 GHz.

4. The wiring board according to claim 1, wherein the metal layer comprises gold, silver, copper, platinum, tin, aluminum, iron, or nickel.

5. The wiring board according to claim 1, wherein the substrate has a dielectric loss tangent of 0.002 or less.

6. The wiring board according to claim 1, wherein the substrate has a thickness of 5 μm or more and 200 μm or less.

7. The wiring board according to claim 1, wherein the substrate comprises cycloolefin polymer or polynorbornene polymer.

8. The wiring board according to claim 1, wherein the mesh wiring layer is provided only on a portion of the substrate.

9. The wiring board according to claim 1, wherein a protective layer is formed on an entire region of the mesh wiring layer, and a thickness of the protective layer in a range of 0.3 μm or more to 10 μm or less.

10. A method for manufacturing a wiring board, the method comprising:
    a step of preparing a substrate; and
    a step of forming a mesh wiring layer including a plurality of wiring lines on the substrate,
    wherein the substrate has a transmittance of 85% or more for light with a wavelength of 380 nm or more and 750 nm or less,
    wherein each of the wiring lines includes a metal layer and a blackened layer disposed on the metal layer,
    wherein the blackened layer has a thickness of 5 nm or more and 100 nm or less, and
    wherein the blackened layer comprises an oxide of a metal contained in the metal layer.

11. The method for manufacturing a wiring board according to claim 10, wherein the step of forming the mesh wiring layer includes a step of forming the metal layer and a step of subjecting the metal layer to an oxidation process to form the blackened layer.

12. The method for manufacturing a wiring board according to claim 10, wherein the mesh wiring layer is an antenna which transmits and receives radio waves of 28 GHz to 39 GHz.

13. The method for manufacturing a wiring board according to claim 10, wherein the metal layer comprises gold, silver, copper, platinum, tin, aluminum, iron, or nickel.

14. The method for manufacturing a wiring board according to claim 10, wherein the substrate has a dielectric loss tangent of 0.002 or less.

15. The method for manufacturing a wiring board according to claim 10, wherein the substrate has a thickness of 5 μm or more and 200 μm or less.

16. The method for manufacturing a wiring board according to claim 10, wherein the substrate comprises cycloolefin polymer or polynorbornene polymer.

17. The method for manufacturing a wiring board according to claim 10, wherein the mesh wiring layer is provided only on a portion of the substrate.

18. The method for manufacturing a wiring board according to claim 10, wherein a protective layer is formed on an entire region of the mesh wiring layer, and a thickness of the protective layer in a range of 0.3 μm or more to 10 μm or less.

* * * * *